(12) United States Patent
Kitsomboonloha et al.

(10) Patent No.: US 11,580,905 B2
(45) Date of Patent: Feb. 14, 2023

(54) DISPLAY WITH HYBRID OXIDE GATE DRIVER CIRCUITRY HAVING MULTIPLE LOW POWER SUPPLIES

(71) Applicant: Apple Inc., Cupertino, CA (US)

(72) Inventors: Rungrot Kitsomboonloha, San Jose, CA (US); Chin-Wei Lin, San Jose, CA (US); Shinya Ono, Santa Clara, CA (US); Gihoon Choo, San Jose, CA (US); Hao-Lin Chiu, Los Gatos, CA (US); Kyung Wook Kim, Saratoga, CA (US); Pei-En Chang, San Jose, CA (US); Szu-Hsien Lee, Los Gatos, CA (US); Zino Lee, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/749,045

(22) Filed: May 19, 2022

(65) Prior Publication Data

US 2023/0014107 A1 Jan. 19, 2023

Related U.S. Application Data

(60) Provisional application No. 63/221,707, filed on Jul. 14, 2021.

(51) Int. Cl.
*G09G 3/3225* (2016.01)

(52) U.S. Cl.
CPC ...... *G09G 3/3225* (2013.01); *G09G 2300/0426* (2013.01); *G09G 2310/0291* (2013.01); *G09G 2310/08* (2013.01); *G09G 2330/028* (2013.01)

(58) Field of Classification Search
CPC ... G09G 2310/0286; G09G 2310/0289; G09G 3/3266
See application file for complete search history.

(56) References Cited

U.S. PATENT DOCUMENTS

| | | | |
|---|---|---|---|
| 6,628,259 B2 | 9/2003 | Hashimoto | |
| 7,514,961 B2 | 4/2009 | Tseng et al. | |
| 7,787,096 B2 | 8/2010 | Ohgichi et al. | |
| 8,653,893 B2 | 2/2014 | Tsuchi | |
| 10,078,405 B2 | 9/2018 | Jamshidi Roudbari et al. | |
| 10,607,543 B2 | 3/2020 | Chaji | |
| 10,923,022 B2 | 2/2021 | Lin et al. | |
| 10,991,302 B1* | 4/2021 | Park | G09G 3/3266 |
| 10,998,344 B2 | 5/2021 | Gupta et al. | |
| 2014/0064439 A1* | 3/2014 | Qing | G09G 3/3674 377/75 |
| 2014/0204009 A1* | 7/2014 | Kim | H03K 17/145 327/109 |

(Continued)

*Primary Examiner* — Sepehr Azari
(74) *Attorney, Agent, or Firm* — Treyz Law Group, P.C.; Jason Tsai (57) ABSTRACT

A display may include an array of pixels that receive control signals from a chain of gate drivers. Each gate driver may include a logic sub-circuit and an output buffer sub-circuit. The output buffer sub-circuit may include depletion mode semiconducting oxide transistors with high mobility. The logic sub-circuit may include semiconducting oxide transistors, some of which can be depletion mode transistors and some of which can be enhancement mode transistors with lower mobility. The logic sub-circuit may include at least a carry circuit, a voltage setting circuit, an inverting circuit, a discharge circuit.

21 Claims, 9 Drawing Sheets

(56) References Cited

U.S. PATENT DOCUMENTS

| | | | |
|---|---|---|---|
| 2017/0032733 A1* | 2/2017 | Jang | G09G 3/20 |
| 2018/0151146 A1* | 5/2018 | Chang | G09G 3/3696 |
| 2019/0244577 A1* | 8/2019 | Kusumi | G09G 3/3677 |
| 2020/0066211 A1* | 2/2020 | Lee | G09G 3/3266 |
| 2020/0286572 A1* | 9/2020 | Deng | G11C 19/28 |
| 2021/0201818 A1* | 7/2021 | Jang | H01L 27/124 |
| 2022/0199034 A1* | 6/2022 | Yun | G09G 3/3266 |

* cited by examiner

DISPLAY WITH HYBRID OXIDE GATE DRIVER CIRCUITRY HAVING MULTIPLE LOW POWER SUPPLIES

This application claims the benefit of provisional patent application No. 63/221,707, filed Jul. 14, 2021, which is hereby incorporated by reference herein in its entirety.

BACKGROUND

This relates generally to electronic devices with displays and, more particularly, to display driver circuitry for displays such as organic light-emitting diode (OLED) displays.

Electronic devices often include displays. For example, cellular telephones, tablets, wrist-watches, and portable computers typically include displays for presenting image content to users. OLED displays have an array of display pixels based on light-emitting diodes. In this type of display, gate driver circuitry is used to provide control signals to respective rows in the array of display pixels. It can be challenging to design the gate driver circuitry.

SUMMARY

An electronic device may include a display having an array of display pixels. The display pixels may be organic light-emitting diode display pixels. Each display pixel may include at least an organic light-emitting diode (OLED) that emits light and associated semiconducting oxide transistors.

The array of display pixels may receive control signals such as gate output signals from peripheral gate driver circuitry. The gate driver circuitry may include a chain of gate driver circuits. Each gate driver circuit in the chain may include a output buffer sub-circuit and a logic sub-circuit. The output buffer sub-circuit is configured to generate one of the gate output signals, whereas the logic sub-circuit is configured to generate a carry output signal that can be fed to another gate driver circuit in the chain.

The output buffer sub-circuit may include a first semiconducting oxide transistor and a second semiconducting oxide transistor coupled in series between a first positive power supply voltage and a first ground power supply voltage. The first and second semiconducting oxide transistors may be implemented as depletion mode transistors having a negative threshold voltage and a first mobility (i.e., a first amount or degree of mobility). A capacitor may be coupled across the gate and source terminals of the first semiconducting oxide transistor.

The logic sub-circuit may be powered by a second positive power supply voltage and a second ground power supply voltage. Some of the transistors in the logic sub-circuit can optionally be implemented as depletion mode transistors having the negative threshold voltage and the first mobility, while all remaining transistors in the logic sub-circuit can be implemented as enhancement mode transistors having a positive threshold voltage and a second mobility less than the first mobility (i.e., a second amount or degree of mobility that is less than first amount/degree of mobility). The first positive power supply voltage can be less than the second positive power supply voltage, and the first ground power supply voltage can be greater than the second ground power supply voltage. Configured in this way, the logic sub-circuit is able to property deactivate the first and second semiconducting oxide transistors even when their threshold voltage is negative.

The logic sub-circuit may include a carry circuit configured to generate the carry output signal, a voltage setting circuit coupled to a gate terminal of the first semiconducting oxide transistor, an inverter circuit coupled to a gate terminal of the second semiconducting oxide transistor, and a discharging circuit configured to discharge at least the gate terminal of the first semiconducting oxide transistor. The carry circuit can be coupled to the second positive power supply voltage or a gate output signal from a preceding gate driver circuit in the chain. The voltage setting circuit may receive a clock signal and another carry output signal from a preceding gate driver circuit in the chain. The inverter circuit may include a semiconducting oxide transistor that is coupled to the second positive power supply voltage, that is configured to receive a clock signal, and/or that is configured to receive an adjustable reference voltage. The discharging circuit may include only one discharge transistor coupled to the gate terminal of the first semiconducting oxide transistor or multiple discharge transistors coupled to different nodes in the gate driver circuit.

DETAILED DESCRIPTION

Figure 1:
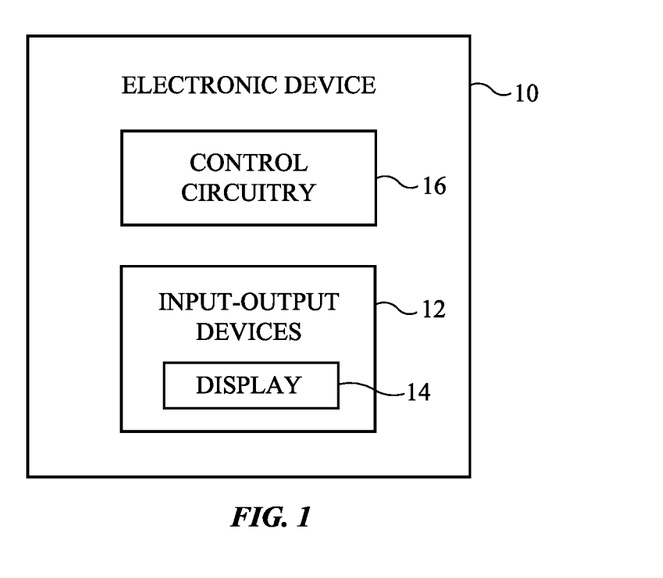
FIG. 1 is a diagram of an illustrative electronic device having a display in accordance with some embodiments.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, application processors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode (OLED) display are sometimes described herein as an example. This is, however, merely illustrative. Any suitable type of display may be used in device 10, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
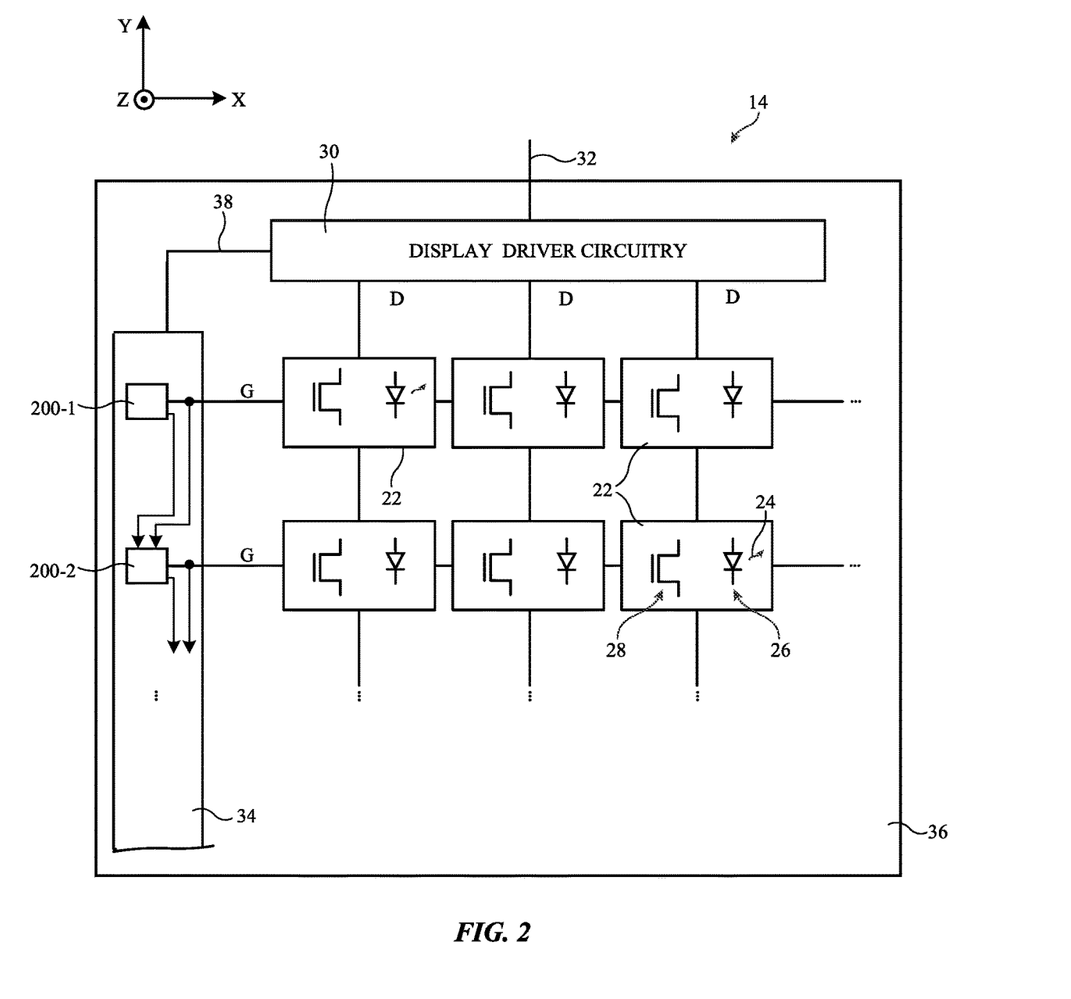
FIG. 2 is a diagram of an illustrative display having an array of organic light-emitting diode display pixels in accordance with some embodiments.

A top view of a portion of display 14 is shown in FIG. 2. As shown in FIG. 2, display 14 may have an array of pixels 22 formed on a substrate 36. Substrate 36 may be formed from glass, metal, plastic, ceramic, porcelain, or other substrate materials. Pixels 22 may receive data signals over signal paths such as data lines D (sometimes referred to as data signal lines, column lines, etc.) and may receive one or more control signals over control signal paths such as horizontal control lines G (sometimes referred to as gate lines, scan lines, emission lines, row lines, etc.). There may be any suitable number of rows and columns of pixels 22 in display 14 (e.g., tens or more, hundreds or more, or thousands or more).

Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry 30 may be used to control the operation of pixels 22. The display driver circuitry 30 may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row driver circuitry) may be implemented as part of an integrated circuit and/or may be implemented using thin-film transistor circuitry. Horizontal/row control lines G in display 14 may carry gate line signals (scan line control signals), emission enable control signals, and/or other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.). Gate driver circuitry 34 may include multiple gate driver circuits (e.g., gate drivers 200-1, 200-2, and so on) connected in a chain. For example, each gate driver may be configured to generate one or more scan signals and/or carry signals that are fed forward to a succeeding gate driver in the chain or that are fed back to a preceding gate driver in the chain.

In accordance with some embodiments, pixels 22 and gate driver circuitry 34 may be implemented using thin-film transistors such as semiconducting oxide transistors. Semiconducting oxide transistors are defined as thin-film transistors having a channel region formed from semiconducting oxide material (e.g., indium gallium zinc oxide or IGZO, indium tin zinc oxide or ITZO, indium gallium tin zinc oxide or IGTZO, indium tin oxide or ITO, or other semiconducting oxide material) and are generally considered n-type (n-channel) transistors.

A semiconducting oxide transistor is notably different than a silicon transistor (i.e., a transistor having a polysilicon channel region deposited using a low temperature process sometimes referred to as LTPS or low-temperature polysilicon). Semiconducting oxide transistors exhibit lower leakage than silicon transistors, so implementing at least some of the transistors within pixel 22 can help reduce flicker (e.g., by preventing current from leaking away from the gate terminal of drive transistor Tdrive). Pixels 22 and gate driver circuitry 34 may be formed using only semiconducting oxide transistors (i.e., display 14 does not include any silicon transistors).

In other suitable embodiments, at least some of the transistors within pixel 22 and/or gate driver circuitry 34 may be implemented as silicon transistors such that pixel 22 and/or gate driver circuitry 34 includes a combination of semiconducting oxide transistors and silicon transistors (e.g., n-type LTPS transistors or p-type LTPS transistors).

Different transistors within display 14 may require different device characteristics for optimal display performance and operation. For instance, transistors that are predominantly in the off state may require more negative-bias-temperature-stress (NBTS) stability. As another example, transistors that are predominantly in the on state may require more positive-bias-temperature-stress (PBTS) stability. At least some transistors within gate driver circuitry 34 may benefit from better PBTS and higher mobility for enhance drive-ability.

To satisfy these different requirements, display 14 may be formed using semiconducting oxide transistors with different device characteristics. For instance, a first subset of the semiconducting oxide transistors in display 14 may be formed to achieve high mobility and high drive current. Such semiconducting oxide transistors with high mobility exhibit a high reliability metric but exhibit a low or negative threshold voltage, which results in high leakage current under positive bias. High mobility semiconducting oxide transistors of this type are sometimes referred to as "depletion mode" devices or switches. A depletion mode semiconducting oxide transistor may have a threshold voltage that is equal to −1 V, −2 V, −3 V, −4 V, or other negative voltage.

A second subset of the semiconducting oxide transistors in display 14 may be formed to achieve a higher or positive threshold voltage, which results in low leakage currents and are suitable for low refresh rate displays (e.g., displays having refresh rates lower than 60 Hz, lower than 30 Hz, lower than 10 Hz, around 1 Hz, around 2 Hz, 1-10 Hz, or less than 1 Hz). Semiconducting oxide transistors of this type may exhibit low mobility and are sometimes referred to as "enhancement mode" devices or switches. An enhancement mode semiconducting oxide transistor may have a threshold voltage that is equal to 1 V, 2 V, 3 V, 0-4 V, or other positive voltage. To provide semiconducting oxide transistors with different device characteristics, multiple layers of semiconducting oxide material may be formed at different processing steps.

Figure 3:
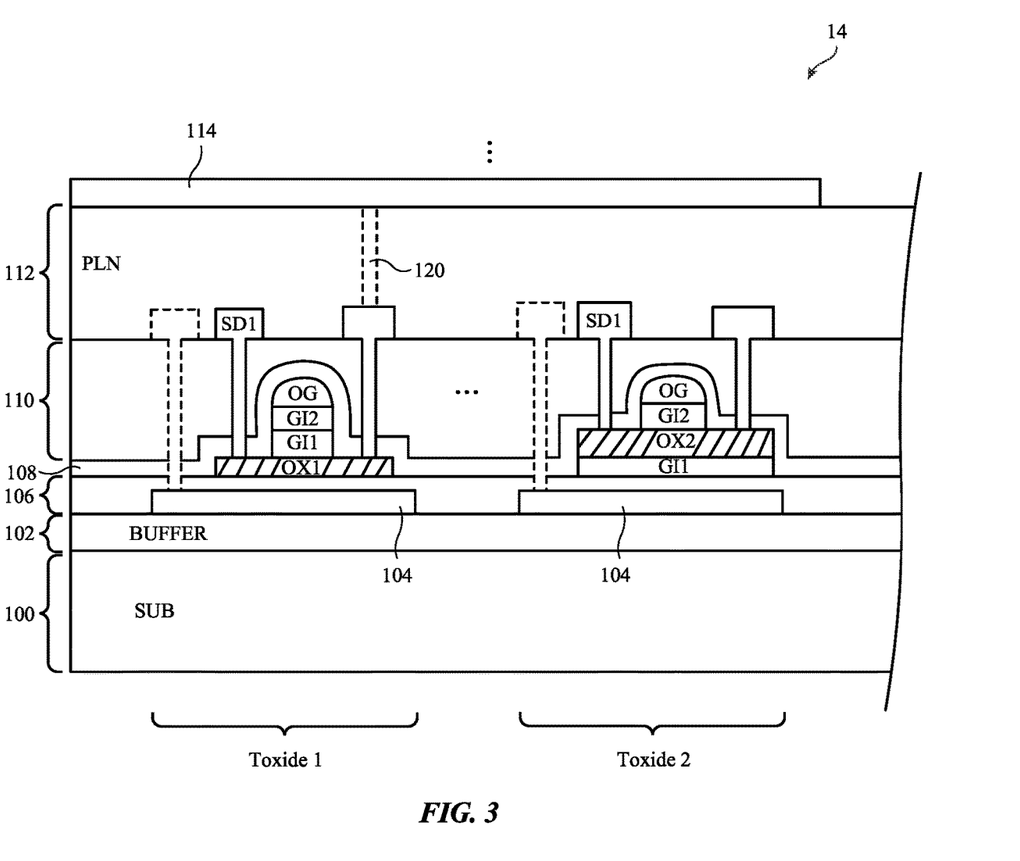
FIG. 3 is a cross-sectional side view of an illustrative display having at least two different semiconducting oxide layers in accordance with some embodiments.

FIG. 3 is a cross-sectional side view of display 14 having at least two different semiconducting oxide layers (e.g., semiconducting oxide layers formed at different processing steps using different materials or optionally using the same material). A "semiconducting oxide layer" is defined as an oxide layer that is formed from a semiconductor such as IGZO, IGTZO, ITO, ITZO, or other semiconductor material. As shown in FIG. 3, display 14 may have a display stackup that includes a substrate layer such as substrate 100. Substrate 100 may optionally be covered with one or more buffer layers 102. Buffer layer(s) 102 may include inorganic buffer layers such as layers of silicon oxide, silicon nitride, or other passivation or dielectric material.

A conductive layer such as metal layer 104 may be formed on buffer layer 102. Conductive layer 104 may be a blanket layer when initially deposited on layer 102. Conductive layer 104 may be patterned to form respective metal shielding or bottom gate conductors for respective semiconducting oxide transistors such as Toxide1 and Toxide2. Metal layer 104 may be formed using molybdenum, aluminum, nickel, chromium, copper, titanium, silver, gold, a combination of these materials, other metals, or other suitable conductive material. Metal layer 104 may serve as a bottom shielding layer (e.g., a shielding layer configured to block potentially interfering electromagnetic fields and/or light). Metal layer 104 may also serve as a bottom gate conductor for one or more semiconducting oxide transistors (e.g., semiconducting oxide transistors Toxide1 and Toxide2). A buffer insulating layer such as buffer insulating layer 106 may be formed over metal layer 104 and on buffer layer 102. Buffer insulating layer 106 (sometimes referred to as a second buffer layer) may be formed from silicon oxide, silicon nitride, or other passivation or insulating material.

A first oxide layer OX1 may be formed on insulating layer 106. Oxide layer OX1 is formed from semiconductor material. A first gate insulating layer GI1 may be formed over first oxide layer OX1. A second oxide layer OX2 may be formed on first gate insulating layer GI1. Oxide layer OX2 is also formed from semiconductor material. Second oxide layer OX2 may be formed over first oxide layer OX1. Oxide layers OX1 and OX2 may be blanket layers when first deposited. Oxide layer OX1 may be patterned to formed respective portions of first semiconducting oxide transistors (e.g., a portion of oxide layer OX1 is patterned to form the active region of transistor Toxide1). Oxide layer OX2 may be patterned to formed respective portions of second semiconducting oxide transistors (e.g., a portion of oxide layer OX2 is patterned to form the active region of transistor Toxide2).

A second gate insulating layer GI2 (which is formed separately from GI1) may be formed over second oxide layer OX2. Gate insulating layers GI1 and GI2 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material. Gate insulating layers GI1 and GI2 may be blanket layers when first deposited. A first portion of layer GI1 may be patterned in between layer OX1 and the gate conductor of Toxide1, whereas a second portion of layer GI1 may be patterned under layer OX2 of Toxide2. A first portion of layer GI2 may be patterned in between layer OX1 and the gate terminal of Toxide1, whereas a second portion of layer GI2 may be patterned in between layer OX2 and the gate conductor of Toxide2. A top gate conductive layer such as gate layer OG may be formed on second gate insulating layer GI2. Top gate conductor(s) OG may be formed from molybdenum, titanium, aluminum, nickel, chromium, copper, silver, gold, a combination of these materials, other metals, or other suitable gate conductor material.

In the example of FIG. 3, semiconducting oxide transistor Toxide1 includes channel and source-drain active regions formed using first semiconducting oxide layer OX1, whereas semiconducting oxide transistor Toxide2 includes channel and source-drain active regions formed using second semiconducting oxide layer OX2. Semiconducting oxide transistor Toxide1 has gate insulating layers GI1 and GI2 separating oxide layer OX1 from its gate conductor OG. Semiconducting oxide transistor Toxide2 has only gate insulating layer GI2 separating oxide layer OX2 from its gate conductor OG. Thus, the overall gate insulator of Toxide1 is thicker than the gate insulator of Toxide2. This difference in the overall thickness and composition of the gate insulating layer can be used to provide different device characteristics between transistor Toxide1 and Toxide2. Gate insulating layer GI1 may be formed using the same or different material as gate insulating layer GI2. In the scenario where conductors 104 also serve as bottom gate conductors, the bottom gate insulator thickness of transistor Toxide1 will be determined by the thickness of layer 106, whereas the bottom gate insulator thickness of transistor Toxide2 will be determined by the combined thickness of layers 106 and GI1 This difference in gate insulator thickness above and below the semiconducting oxide active region can be used to achieve different device characteristics.

In general, transistor Toxide1 and transistor Toxide2 may represent any semiconducting oxide transistor within display 14. As an example, transistor Toxide1 may be designed to provide improved reliability by using IGZO, whereas transistor Toxide2 may be designed to provide improved mobility by using IGZTO. The use of at least two different semiconducting oxide transistors is not limited to only the active display area but can also be extended to the gate driver circuits and other peripheral display control circuits. Using different types of semiconducting oxide transistors across different areas of display 14 can enable high performance while also reducing panel border.

Semiconducting oxide layers OX1 and OX2 may be formed from the same or different semiconducting oxide material. If desired, oxide layer OX1 may be formed using a multilayer stackup of IGTZO, IGZO(111), and IGTZO to achieve good PBTS. The "111" notation refers to a 1:1:1 composition ratio between indium, gallium, and zinc, respectively. Different composition ratios can be adjusted to provide different device characteristics. As another example, to achieve good PBTS, oxide layer OX1 can be formed using IGZO(111) deposited using a relatively low oxide/argon deposition gas ratio (e.g., 20-40% oxide/argon deposition gas ratio). As another example, to achieve good PBTS, transistor Toxide1 can have its gate insulating layers GI1 and/or GI2 deposited using a relatively low nitrous oxide/silicon hafnium gas ratio (e.g., 20-40% $N_2O/SiH_4$ deposition gas ratio).

In other suitable embodiments, transistor Toxide1 can be formed to achieve good NBTS. To achieve good NBTS, oxide layer OX1 may be formed using a multilayer stackup of IGTZO, IGZO(136), and IGTZO to achieve good NBTS. The "136" notation refers to a 1:3:6 composition ratio between indium, gallium, and zinc, respectively. Different composition ratios can be adjusted to provide different device characteristics. As another example, to achieve good NBTS, oxide layer OX1 can be formed using IGZO(111) deposited using a relatively high oxide/argon deposition gas ratio (e.g., 80-90% oxide/argon deposition gas ratio). As another example, to achieve good NBTS, transistor Toxide1 can have its gate insulating layers GI1 and/or GI2 deposited using a relatively high nitrous oxide/silicon hafnium gas ratio (e.g., 80-90% $N_2O/SiH_4$ deposition gas ratio).

In other suitable embodiments, transistor Toxide1 can be formed to achieve high mobility. To achieve high mobility, oxide layer OX1 may be formed using high mobility material such as IGTZO, ITO, ITZO, a combination of these materials, and/or other high mobility compound(s). As another example, to achieve high mobility, oxide layer OX1 can be formed using IGZO(111) deposited using a relatively low oxide/argon deposition gas ratio (e.g., 20-40% oxide/argon deposition gas ratio).

If desired, transistor Toxide2 (including oxide layer OX2) can be formed using a different material and/or using different deposition techniques than transistor Toxide1 to provide different device characteristics. As an example, oxide layer OX2 may be formed using a multilayer stackup of IGTZO, IGZO(111), and IGTZO to achieve good PBTS. As another example, to achieve good PBTS, oxide layer OX2 can be formed using IGZO(111) deposited using a relatively low oxide/argon deposition gas ratio (e.g., 20-40% oxide/argon deposition gas ratio). As another example, to achieve good PBTS, transistor Toxide2 can have its gate insulating layer GI2 deposited using a relatively low nitrous oxide/silicon hafnium gas ratio (e.g., 20-40% $N_2O/SiH_4$ deposition gas ratio).

In other suitable embodiments, transistor Toxide2 can be formed to achieve good NBTS. To achieve good NBTS, oxide layer OX2 may be formed using a multilayer stackup of IGTZO, IGZO(136), and IGTZO to achieve good NBTS. As another example, to achieve good NBTS, oxide layer OX2 can be formed using IGZO(111) deposited using a relatively high oxide/argon deposition gas ratio (e.g., 80-90% oxide/argon deposition gas ratio). As another example, to achieve good NBTS, transistor Toxide2 can have its gate insulating layer GI2 deposited using a relatively high nitrous oxide/silicon hafnium gas ratio (e.g., 80-90% $N_2O/SiH_4$ deposition gas ratio).

In other suitable embodiments, transistor Toxide2 can be formed to achieve high mobility. To achieve high mobility, oxide layer OX2 may be formed using high mobility material such as IGTZO, ITO, ITZO, a combination of these materials, and/or other high mobility compound(s). As another example, to achieve high mobility, oxide layer OX2 can be formed using IGZO(111) deposited using a relatively low oxide/argon deposition gas ratio (e.g., 20-40% oxide/argon deposition gas ratio).

Still referring to FIG. 3, a first interlayer dielectric (ILD1) layer 108 may be formed over the OG conductor. A second interlayer dielectric (ILD2) layer 110 may be formed on ILD1 layer 108. The ILD layers 108 and 110 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material. Layers 108 and 110 may be formed from the same or different material.

A first source-drain metal routing layer SD1 may be formed on layer 110. The SD1 metal routing layer may be formed from aluminum, nickel, chromium, copper, molybdenum, titanium, silver, gold, a combination of these materials (e.g., a multilayer stackup of Ti/Al/Ti), other metals, or other suitable metal routing conductors. The SD1 metal routing layer may be patterned and/or etch to form SD1 metal routing paths.

As shown in FIG. 3, some of the SD1 metal routing paths may be coupled using vertical via(s) to one or more source-drain regions associated with transistor Toxide1 and to one or more source-drain regions associated with transistor Toxide2. Some of the SD1 metal routing paths may optionally be coupled to the bottom conductive layer 104 (see dotted structures in FIG. 3).

A planarization (PLN) layer such as layer 112 may be formed over the SD1 metal routing layer. Planarization layer 112 may be formed from organic dielectric materials such as polymer. An anode layer including an anode conductor 114 forming the anode terminal of the organic light-emitting diode 26 may be formed on planarization layer 112. Anode conductor 114 may be coupled to at least some of the SD1 metal routing paths using vertical via(s) 120 formed through planarization layer 112. Additional structures may be formed over the anode layer. For example, a pixel definition layer, a spacer structure, organic light-emitting diode emissive material, a cathode layer, and other pixel structures may also be included in the stackup of display pixel 22. However, these additional structures are omitted for the sake of clarity and brevity.

Figure 4:
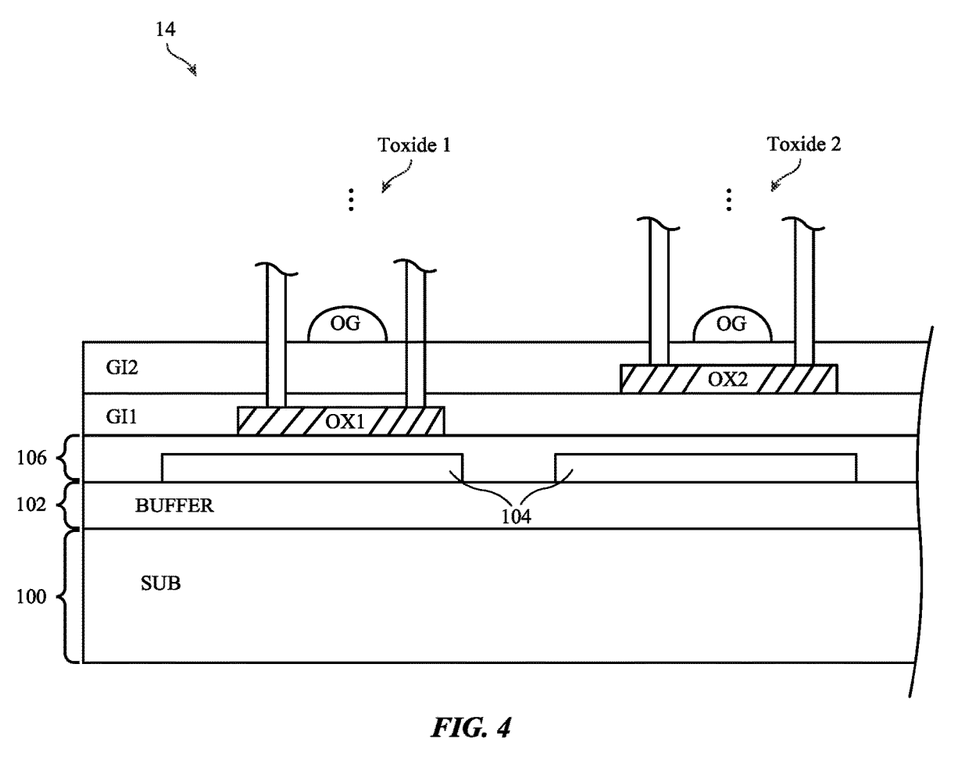
FIG. 4 is a cross-sectional side view of an illustrative display having different semiconducting oxide layers and blanket gate insulating layers in accordance with some embodiments.

The example of FIG. 3 in which gate insulating layers GI1 and GI2 are patterned and self-aligned with the overlying gate conductors OG is merely illustrative. FIG. 4 illustrates another suitable embodiment in which gate insulating layers GI1 and GI2 are not patterned and remain as blanket layers in the final product. As shown in FIG. 4, first gate insulating layer GI1 is a blanket layer that extends across the width of display 14 and covers first semiconducting oxide layer OX1 and layer 106. Second gate insulating layer GI2 is also a blanket layer that extends across the width of display 14 and covers first gate insulating layer GI1 and second semiconducting oxide layer OX2.

Conventional gate drivers include only one type of semiconducting oxide transistors. In other words, all transistors within the gate driver circuitry have the same semiconducting oxide material formed in the same layer in the display stackup. It can be challenging to design gate driver circuits under such constraints.

Figure 5:
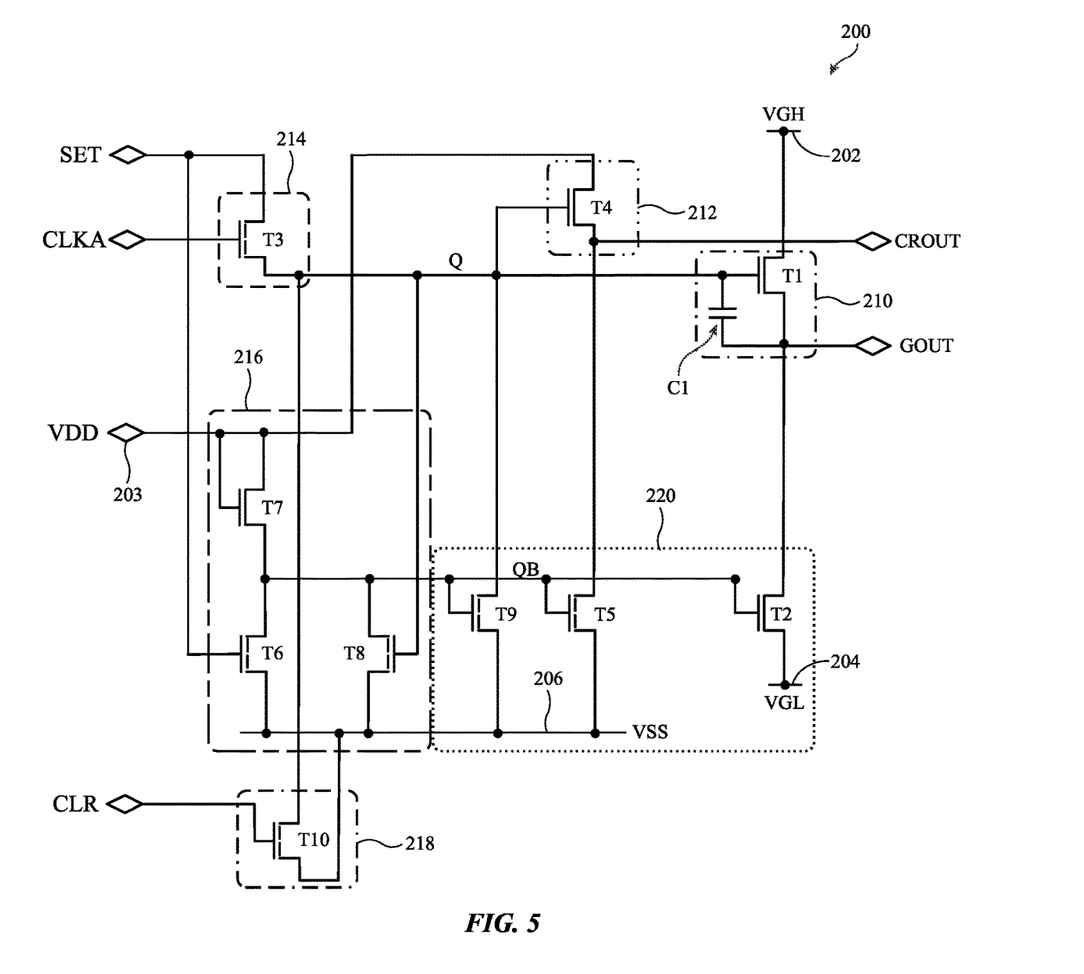
FIG. 5 is a circuit diagram of an illustrative gate driver circuit in accordance with some embodiments.

In accordance with some embodiments, display 14 (see FIG. 2) may be provided with gate driver circuitry 34 formed using different types of semiconducting oxide transistors (e.g., transistors Toxide1 and Toxide2 of the type described in connection with FIGS. 3 and 4). Gate driver circuitry 34 formed using different types of semiconducting oxide transistors is sometimes referred to as "hybrid" oxide gate driver circuitry. FIG. 5 is a circuit diagram of an illustrative gate driver circuit 200 that can be formed as part of gate driver circuitry 34. As shown in FIG. 5, gate driver circuit 200 may include various constituent portions such as an output circuit 210, a carry circuit 212, a voltage setting circuit 214, an inverting circuit 216 (sometimes referred to as an inverter), a clearing circuit 218, and a voltage holding circuit 220.

The output circuit 210 may include a semiconducting oxide transistor T1 having a drain terminal coupled to a positive power supply terminal 202 (e.g., a positive power supply line on which positive power supply voltage VGH is provided), a gate terminal coupled to a node Q, and a source terminal coupled to the output port of gate driver 200 on which output signal GOUT is generated. Positive power supply voltage VGH may be 3 V, 4 V, 5 V, 6 V, 7 V, 2 to 8 V, greater than 6 V, greater than 8 V, greater than 10 V, greater than 12 V, 6-12 V, 12-20 V, or any suitable positive power supply voltage level. Gate driver output signal GOUT may represent a scan signal, an emission signal, a reset signal, an initializing signal, some other row control signal, or other time-varying control signal. Output circuit 210 may further include a capacitor such as capacitor C1 having a first terminal coupled to the gate terminal of transistor T1 and a second terminal coupled to the source terminal of transistor T1. The terms "source" and "drain" terminals that are used to describe current-conducting terminals of a transistor are sometimes interchangeable and may sometimes be referred to herein as "source-drain" terminals.

The carry circuit 212 may include a semiconducting oxide transistor T4 having a gate terminal coupled to node Q, a drain terminal coupled to another positive power supply terminal 203 (e.g., a positive power supply line on which positive power supply voltage VDD is provided), and a source terminal on which a carry output signal CROUT is generated. Signals CROUT and GOUT may optionally be fed to a succeeding (or preceding) gate driver circuit in the chain of gate drivers. Positive power supply voltage VDD may be 3 V, 4 V, 5 V, 6 V, 7 V, 2 to 8 V, greater than 6 V, greater than 8 V, greater than 10 V, greater than 12 V, 6-12 V, 12-20 V, or any suitable positive power supply voltage level. In general, voltage VDD may be greater than voltage VGH (e.g., voltage VDD may be at least 1 V greater, 2 V greater, 3 V greater, or 4 V greater than VGH). This is merely illustrative. If desired, voltage VDD may be equal to or less than voltage VGH.

The voltage setting circuit 214 may include a semiconducting oxide transistor T3 having a source terminal coupled to node Q, a gate terminal configured to receive a clock signal CLKA, and a drain terminal configured to receive a set voltage SET. Voltage setting circuit 214 may be used to set the voltage at node Q. When setting the voltage at node Q to a high voltage, signal SET is asserted (e.g., driven high). When setting the voltage at node Q to a low voltage, signal SET is deasserted (e.g., driven low).

The inverting circuit 216 may include semiconducting oxide transistor T6 coupled in series with semiconducting oxide transistor T7. In particular, transistor T7 has gate and drain terminal coupled to power supply terminal 203 and has a source terminal coupled to node QB. Node QB generally exhibits a voltage that is opposite in polarity relative to the voltage at node Q (e.g., if node Q is high, then node QB is low, and vice versa). Transistor T6 has a drain terminal coupled to node QB, a gate terminal configured to receive signal SET, and a source terminal coupled to a first ground power supply terminal 206 (e.g., a ground power supply line on which ground voltage VSS is provided). Ground power supply voltage VSS may be 0 V, −2 V, −4, −6V, less than −8 V, less than −10 V, less than −12 voltage, −14 V, or any suitable ground or negative power supply voltage level. Inverter 216 may further include a semiconducting oxide transistor T8 having a drain terminal coupled to node QB, a gate terminal coupled to node Q, and a source terminal coupled to first ground power supply terminal 206. Configured in this way, inverter 216 can be used to generated a complementary voltage at node QB based on the voltages at node Q and the SET signal.

The clearing circuit 218 may include a semiconducting oxide transistor T10 having a drain terminal coupled to node Q, a source terminal coupled to first ground power supply terminal 206, and a gate terminal configured to receive a clear control signal CLR. Clearing circuit 218 may be used to clear (discharge) all internode nodes with gate driver 200 during power on and power off operations to help ensure that driver 200 is powered up correctly and powered off without charge remaining on the internal nodes. During the power on sequence, signal CLR is asserted (e.g., driven high) and all internal will be pulled down to VSS or VGL. During the power off sequence, signal CLR is also asserted and VSS and VGL will transition to a high voltage to discharge the pixels in the active area of the display. After the pixels have been discharged, VSS and VGL will gradually return to a low voltage to discharge all internal nodes. Clearing circuit 218 of this type is sometimes referred to herein as a discharge circuit.

The voltage holding circuit 220 may include semiconducting oxide transistors T2, T5, and T9. Transistor T2 may include a drain terminal coupled to the output port of gate driver 200, a gate terminal coupled to node QB, and a source terminal coupled to a second ground power supply terminal 204 (e.g., a ground power supply line on which ground voltage VGL is provided). Ground power supply voltage VGL may be 0 V, −2 V, −4, −6V, less than −8 V, −10V, or any suitable ground or negative power supply voltage level. In general, voltage VSS may be less than voltage VGL (e.g., voltage VSS may be at least 1 V, 2 V, 3 V, or 4 V less than VGL). This is merely illustrative. If desired, voltage VSS may be equal to or greater than voltage VGL.

Transistor T5 may include a drain terminal coupled to the source terminal of transistor T4 (i.e., the carry output port), a gate terminal coupled to node QB, and a source terminal coupled to second ground power supply terminal 206. Transistor T9 may include a drain terminal coupled to node Q, a gate terminal coupled to node QB, and a source terminal coupled to second ground power supply terminal 206. Configured in this way, holding circuit 220 is used to hold the voltage at node Q and the voltages of output signals GOUT and CROUT. When node Q is low, transistors T1 and T4 are turned off (deactivated), so transistors T5 and T2 are used to hold the voltages of signals CROUT and GOUT, respectively. Node Q can be held by transistor T9 to ensure that the Q node is stable low.

Transistors T1 and T2 directly coupled to the output port of circuit 200 are sometimes referred to collectively as an output buffer sub-circuit (or portion) of circuit 200. The remaining portion of gate driver circuit 200, which includes transistors T3-T10, are sometimes referred to collectively as the logic sub-circuit (or portion) of gate driver 200. The logic sub-circuit can therefore be considered to include carry circuit 212, voltage setting circuit 214, inverting circuit 216, discharge circuit 218, and at least part of holding circuit 220.

In some embodiments, transistors T1 and T2 of the output buffer sub-circuit can be implemented as depletion mode transistors with high mobility. The elevated mobility of output buffer transistors T1 and T2 provides a higher output drive current, thus enabling a smaller device size and helps attain a reduced border size for the overall display. If desired, transistors T4 and T7 may also be implemented as depletion mode transistors with high mobility. Transistor T4 can be used to more efficiently discharge internal node QB within driver 200. Transistor T7 may be used to more efficiently pull up signal CROUT. The remaining transistors within driver 200 (e.g., transistors T3, T5, T6, and T8-T10) may be implemented as enhancement mode transistors with lower mobility. A gate driver circuit 200 that includes some depletion mode semiconducting oxide transistors and some enhancement mode semiconducting oxide transistors is sometimes referred to as a hybrid oxide (or hybrid semiconducting oxide) gate driver.

As described above, depletion mode transistors typically exhibit a negative threshold voltage. Thus, in order to turn off (or deactivate) a depletion mode transistor, the gate-to-source voltage Vgs must also be negative and be less than the threshold voltage. In accordance with an embodiment, the dual ground power supply terminal 204 and 206 can be used to attain a negative Vgs. The negative Vgs can be obtained, for example, by providing a ground voltage VSS on power supply terminal 206 that is less than ground voltage VGL on power supply terminal 204. The voltage difference between VSS and VGL should be greater than the magnitude of the threshold voltage of the depletion mode transistors.

Figure 6:
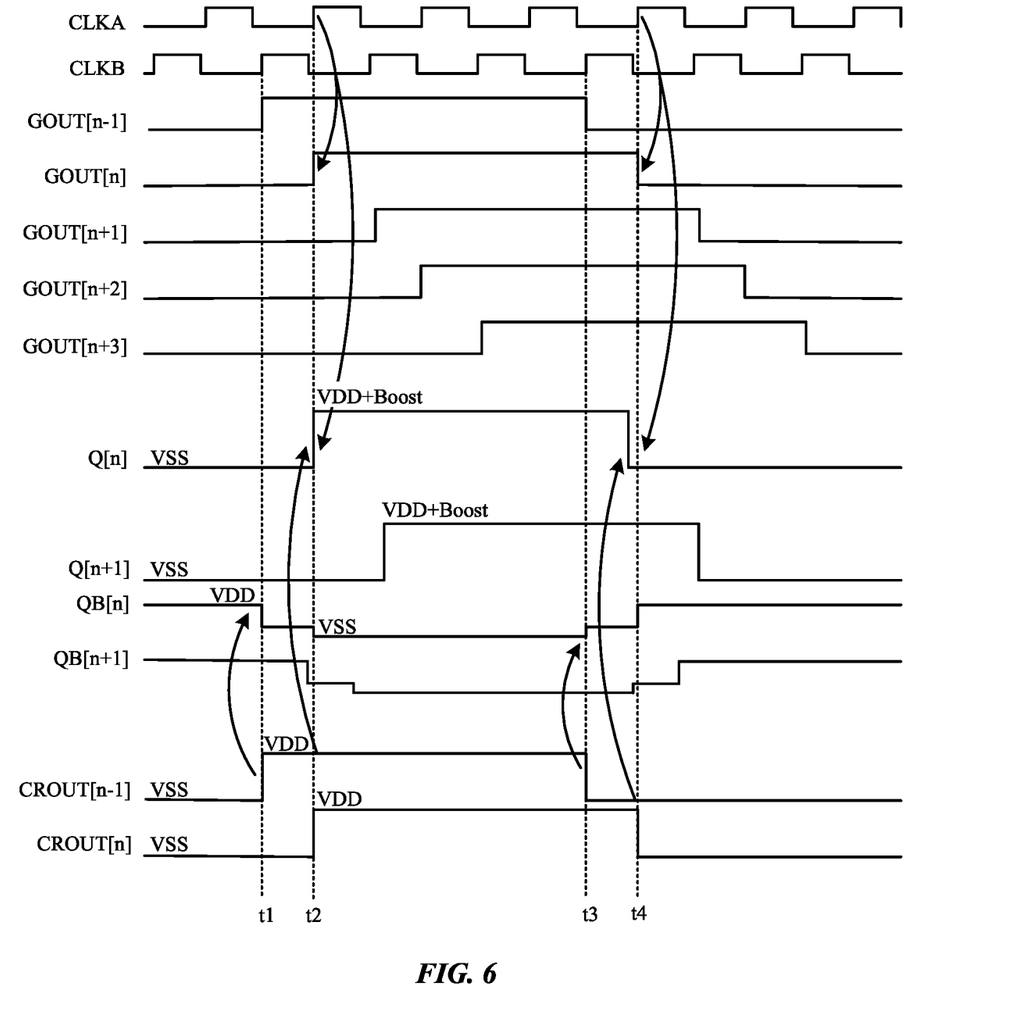
FIG. 6 is a timing diagram illustrating the operation of the gate driver circuit of FIG. 5 in accordance with some embodiments.

FIG. 6 is a timing diagram illustrating the operation of gate driver circuit 200. The notation "[n]" represents a signal for row n; the notation "[n-1]" represents a signal for the row immediately preceding row n (i.e., the row above row n); the notation "[n+1]" represents a signal for the row immediately succeeding row n (i.e., the row below row n); the notation "[n+2]" represents a signal for the row located two rows below row n; and so on. Clock signals CLKA and CLKB may be used to clock alternating rows (e.g., signal CLKA can be used to control the odd rows, whereas signal CLKB can be used to control the even rows, or vice versa). In the example of FIG. 6, clock signal CLKA is used to control rows [ . . . , n-4, n-2, n, n+2, n+4, . . . ], whereas clock signal CLKB is used to control rows [ . . . , n-3, n-1, n+1, n+3, . . . ].

Sampling for each rows occurs at a respective one of the rising clock edge. At time t1, the rising edge of clock signal CLKB will trigger GOUT[n-1] and CROUT[n-1] to be pulsed high. The carry out signal CROUT[n-1] may be fed forward to the next row (i.e., row n) as the SET signal (see FIG. 5). In other words, signal CROUT[n-1] can be used to set the corresponding node QB in the next row high or low (see, e.g., node QB[n] being driven low in response to CROUT[n-1] being driven high).

At time t2, the rising edge of clock signal CLKA will set Q[n] high and trigger GOUT[n] and CROUT[n] to be pulsed high. The carry out signal CROUT[n] may be fed forward to the next row (i.e., row n+1) as the SET signal. In other words, signal CROUT[n] can be used to set the corresponding node QB in the next row high or low.

At time t3, the rising edge of clock signal CLKB will trigger GOUT[n-1] and CROUT[n-1] to be pulsed low. At time t4, the rising edge of clock signal CLKA will set Q[n] low and trigger GOUT[n] and CROUT[n] to be pulsed low. In the example of FIG. 6, the gate output signals GOUT and CROUT all extend over multiple clock signals (i.e., the pulse width of each of signals GOUT and CROUT is at least two clock cycles, at least three clock cycles, at least four clock cycles, etc.).

The operations of FIG. 6 are merely illustrative. At least some of the described operations may be modified or omitted; some of the described operations may be performed in parallel; additional processes may be added or inserted between the described operations; the order of certain operations may be reversed or altered; the timing of the described operations may be adjusted so that they occur at slightly different times, or the described operations may be distributed in a system.

Figure 7:
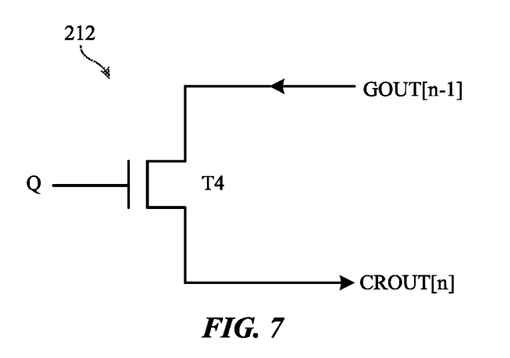
FIG. 7 is a circuit diagram of an illustrative carry circuit that can be included in a gate driver circuit of the type shown in FIG. 5 in accordance with some embodiments.

The example of FIG. 5 in which transistor T4 in carry circuit 212 has a drain terminal coupled to power supply voltage VDD is merely illustrative. FIG. 7 shows another suitable implementation of carry circuit 212 where transistor T4 has a drain terminal configured to receive gate output signal GOUT[n-1] from the previous row, a gate terminal coupled to node Q, and a source terminal on which the carryout signal CROUT[n] for that row is generated. In FIG. 7, transistor T7 may be a depletion mode semiconducting oxide transistor with high mobility. While the carry circuit arrangement of FIG. 5 can provide more voltage separation (isolation) between the logic sub-circuit of the gate driver and the gate output signal GOUT, the carry circuit arrangement of FIG. 7 can provide lower drain-to-source voltage stress and lower carry leakage current.

Figure 8A:
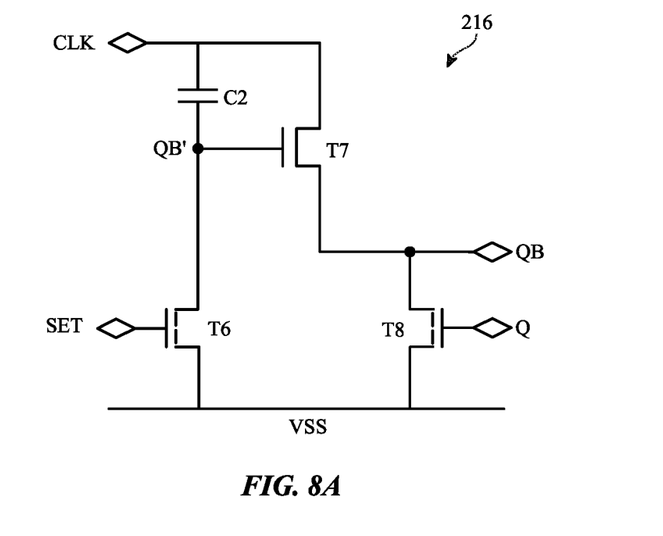
FIGS. 8A and 8B are circuit diagrams of illustrative inverting circuits that can be included in a gate driver circuit of the type shown in FIG. 5 in accordance with some embodiments.

The example of FIG. 5 in which transistor T7 in inverter circuit 216 has drain and gate terminals coupled to power supply voltage VDD is merely illustrative. FIG. 8A shows another suitable implementation of inverter 216 where transistor T7 has a drain terminal coupled to clock signal CLK, a source terminal coupled to node QB, and a gate terminal coupled to node QB'. Inverter 216 may further include another capacitor C2 coupled across the drain and gate terminals of transistor T7. Transistor T6 has a drain terminal coupled to node QB', a gate terminal configured to receive the SET signal (e.g., the carryout signal CROUT[n-1] from the prior row), and a source terminal coupled to ground voltage VSS. Transistor T8 may have a drain terminal coupled to node QB, a gate terminal coupled to node Q, and a source terminal coupled to VSS. In FIG. 8A, transistor T7 may be a depletion mode semiconducting oxide transistor, whereas transistors T6 and T8 can be enhancement mode semiconducting oxide transistors. While the inverter circuit arrangement of FIG. 5 can provide a smaller area and reduced clock loading and power, the inverter circuit arrangement of FIG. 8A can eliminate static current when the inverter is in the low phase (since transistor T6 is no longer coupled in series with T7).

Figure 8B:
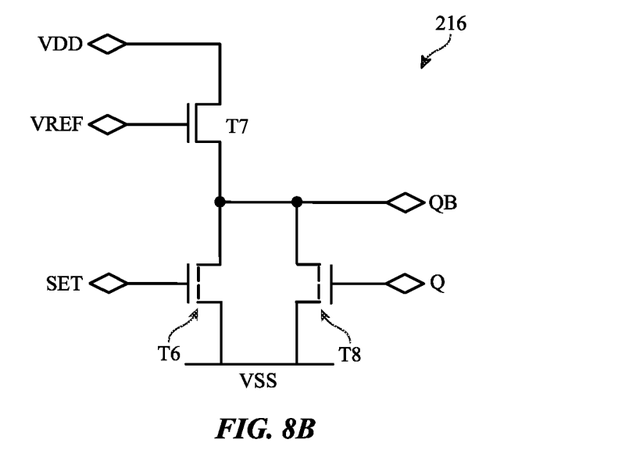

FIG. 8B shows another suitable implementation of inverter 216 where transistor T7 has a drain terminal coupled to power supply voltage VDD, a source terminal coupled to node QB, and a gate terminal configured to receive a reference voltage VREF. Voltage VREF may be an externally supplied reference voltage. Transistor T6 has a drain terminal coupled to node QB, a gate terminal configured to receive the SET signal (e.g., the carryout signal CROUT[n−1] from a prior row), and a source terminal coupled to ground voltage VSS. Transistor T8 may have a drain terminal coupled to node QB, a gate terminal coupled to node Q, and a source terminal coupled to VSS. In FIG. 8B, transistor T7 may be a depletion mode semiconducting oxide transistor, whereas transistors T6 and T8 can be enhancement mode semiconducting oxide transistors. While the inverter circuit arrangement of FIG. 5 can provide a smaller area and reduced clock loading and power, the inverter circuit arrangement of FIG. 8B can adjust the amount of static current flowing through the inverter by controlling voltage VREF.

Figure 9:
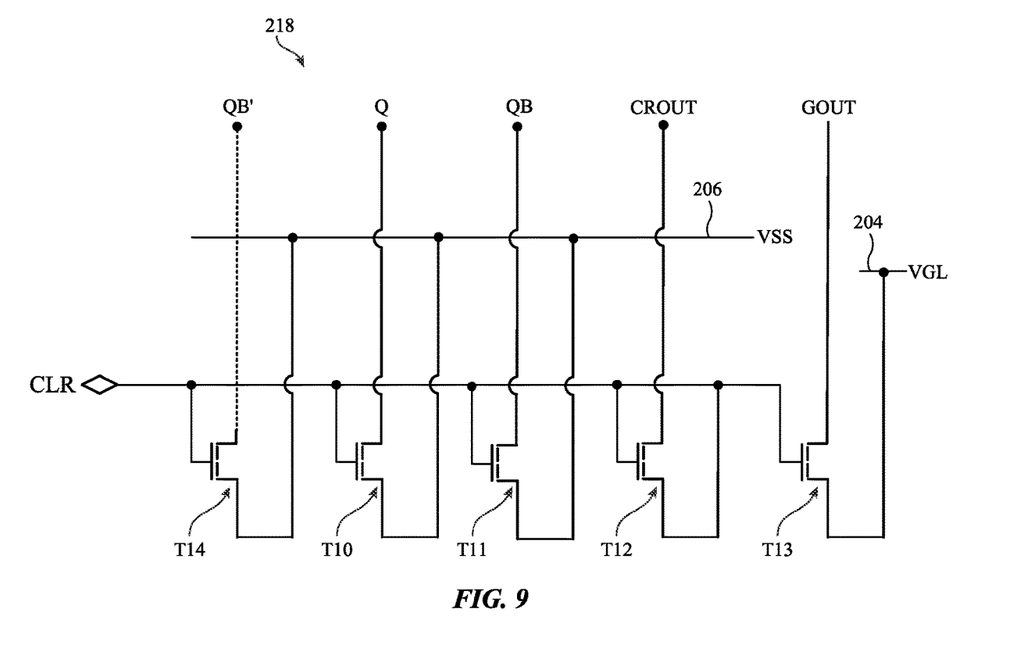
FIG. 9 is a circuit diagram of an illustrative discharge circuit that can be included in a gate driver circuit of the type shown in FIG. 5 in accordance with some embodiments.

The example of FIG. 5 in which the discharge circuit 218 includes one transistor T10 coupled to node Q is merely illustrative. FIG. 9 shows another suitable implementation of discharge circuit 218 that includes multiple discharge transistors coupled to different nodes of gate driver circuit 200. As shown in FIG. 9, discharge circuit 218 may include: a transistor T10 having a source terminal coupled to ground power supply voltage VSS, a gate terminal configured to receive the CLR signal, and a drain terminal coupled to node Q; a transistor T11 having a source terminal coupled to ground power supply voltage VSS, a gate terminal configured to receive the CLR signal, and a drain terminal coupled to node QB; a transistor T12 having a source terminal coupled to ground power supply voltage VSS, a gate terminal configured to receive the CLR signal, and a drain terminal coupled to the carryout port on which signal CROUT is generated; a transistor T13 having a source terminal coupled to ground power supply voltage VGL, a gate terminal configured to receive the CLR signal, and a drain terminal coupled to the gate driver output port on which signal GOUT is generated; and optionally a transistor T14 having a source terminal coupled to ground power supply voltage VSS, a gate terminal configured to receive the CLR signal, and a drain terminal coupled to node QB' (if the inverter circuit has a node QB' as shown in the embodiment of FIG. 8A).

All of the discharge transistors T10-T14 may be enhancement mode semiconducting oxide transistors with low mobility. While the discharge circuit arrangement of FIG. 5 is smaller in area, the discharge circuit arrangement of FIG. 9 can provide more margin for the discharge operation and obviates the need for transistors T4 and T7 to be depletion mode transistors.

The various embodiments of FIGS. 7-9 are not mutually exclusive and can be applied in any combination with one or more portions of gate driver circuit 200 of FIG. 5.

The foregoing is merely illustrative and various modifications can be made to the described embodiments. The foregoing embodiments may be implemented individually or in any combination.

What is claimed is:
1. A display comprising:
an array of pixels; and
a chain of gate driver circuits configured to provide gate output signals to the array of pixels, wherein each gate driver circuit in the chain of gate driver circuits comprises:
an output buffer sub-circuit powered by a first positive power supply voltage and a first ground power supply voltage; and
a logic sub-circuit powered by a second positive power supply voltage and a second ground power supply voltage, wherein the first positive power supply voltage is less than the second positive power supply voltage and wherein the first ground power supply voltage is greater than the second ground power supply voltage.

2. The display of claim 1, wherein the output buffer sub-circuit is configured to generate one of the gate output signals and wherein the logic sub-circuit is configured to generate a carry output signal that is fed to another gate driver circuit in the chain.

3. The display of claim 1, wherein all transistors in the chain of gate driver circuits comprise semiconducting oxide transistors having channels formed from semiconducting oxide material.

4. The display of claim 1, wherein the output buffer sub-circuit comprises first and second semiconducting oxide transistors that are coupled in series between the first positive power supply voltage and the first ground power supply voltage and that exhibit a first mobility.

5. The display of claim 4, wherein the logic sub-circuit comprises a first subset of semiconducting oxide transistors that exhibit the first mobility and a second subset of semiconducting oxide transistors that exhibit a second mobility that is less than the first mobility.

6. The display of claim 4, wherein the logic sub-circuit comprises:
a carry circuit configured to generate a carry output signal;
a voltage setting circuit coupled to a gate terminal of the first semiconducting oxide transistor;
an inverter circuit coupled to a gate terminal of the second semiconducting oxide transistor; and
a discharging circuit configured to discharge at least the gate terminal of the first semiconducting oxide transistor.

7. The display of claim 6, wherein the carry circuit comprises a semiconducting oxide transistor having a drain terminal coupled to the second positive power voltage, a gate terminal coupled to the gate terminal of the first semiconducting oxide transistor, and a source terminal on which the carry output signal is generated.

8. The display of claim 6, wherein the carry circuit comprises a semiconducting oxide transistor having a drain terminal configured to receive one of the gate output signals from a preceding gate driver circuit in the chain, a gate terminal coupled to the gate terminal of the first semiconducting oxide transistor, and a source terminal on which the carry output signal is generated.

9. The display of claim 6, wherein the inverter circuit comprises:
a third semiconducting oxide transistor coupled to the second positive power supply terminal;
a fourth semiconducting oxide transistor configured to receive a carry output signal from a preceding gate driver circuit in the chain; and
a fifth semiconducting oxide transistor coupled in parallel with the fourth semiconducting-oxide transistor.

10. The display of claim 6, wherein the inverter circuit comprises:
a third semiconducting oxide transistor configured to receive a clock signal;
a fourth semiconducting oxide transistor configured to receive a carry output signal from a preceding gate driver circuit in the chain; and
a fifth semiconducting oxide transistor coupled in series with the third semiconducting oxide transistor.

11. The display of claim 6, wherein the inverter circuit comprises:
a third semiconducting oxide transistor having a drain terminal coupled to the second positive power supply terminal and having a gate terminal configured to receive a reference voltage;
a fourth semiconducting oxide transistor configured to receive a carry output signal from a preceding gate driver circuit in the chain; and
a fifth semiconducting oxide transistor coupled in parallel with the fourth semiconducting-oxide transistor.

12. The display of claim 6, wherein the discharging circuit comprises a semiconducting oxide transistor having a drain terminal coupled to the gate terminal of the first semiconducting oxide transistor, a source terminal coupled to the second ground power supply voltage, and a gate terminal configured to receive a clear signal.

13. The display of claim 6, wherein the discharging circuit comprises:
a third semiconducting oxide transistor having a drain terminal coupled to the gate terminal of the first semiconducting oxide transistor, a source terminal coupled to the second ground power supply voltage, and a gate terminal configured to receive a clear signal;
a fourth semiconducting oxide transistor having a drain terminal coupled to the gate terminal of the second semiconducting oxide transistor, a source terminal coupled to the second ground power supply voltage, and a gate terminal configured to receive the clear signal; and
a fifth semiconducting oxide transistor having a drain terminal coupled to a source terminal of the first semiconducting oxide transistor, a source terminal coupled to the first ground power supply voltage, and a gate terminal configured to receive the clear signal.

14. A display comprising:
an array of pixels; and
a plurality of gate driver circuits configured to control the array of pixels, wherein at least one gate driver circuit in the plurality of gate driver circuits comprises:
an output buffer sub-circuit configured to generate a gate output signal and having a first group of semiconducting oxide transistors exhibiting a first mobility; and
a logic sub-circuit configured to generate a carry output signal and having a second group of semiconducting oxide transistors exhibiting a second mobility that is less than the first mobility.

15. The display of claim 14, wherein:
the output buffer sub-circuit is powered by a first positive power supply voltage and a first ground power supply voltage; and
the logic sub-circuit is powered by a second positive power supply voltage different than the first positive power supply voltage and by a second ground power supply voltage different than the first ground power supply voltage.

16. The display of claim 15, wherein the first positive power supply voltage is less than the second positive power supply voltage and wherein the first ground power supply voltage is greater than the second ground power supply voltage.

17. The display of claim 14, wherein the logic sub-circuit further includes a third group of semiconducting oxide transistors exhibiting the first mobility.

18. A display gate driver circuit comprising:
a first semiconducting oxide transistor having a drain terminal coupled to a first positive power supply voltage, a source terminal on which a gate output signal is generated, and a gate terminal;
a second semiconducting oxide transistor having a drain terminal coupled to the source terminal of the first semiconducting oxide transistor, a source terminal coupled to a first ground power supply voltage, and a gate terminal; and
a third semiconducting oxide transistor having a drain terminal configured to receive a carry output signal from another display gate driver circuit, a gate terminal configured to receive a clock signal, and a source terminal coupled to the gate terminal of the first semiconducting oxide transistor, wherein the first and second semiconducting oxide transistors have a first mobility and wherein the third semiconducting oxide transistor has a second mobility less than the first mobility.

19. The display gate driver circuit of claim 18, further comprising:
a fourth semiconducting oxide transistor having a gate terminal coupled to the gate terminal of the first semiconducting oxide transistor and having a source terminal on which an additional carry output signal is generated.

20. The display gate driver circuit of claim 19, further comprising:
an inverter having an output coupled to the gate terminal of the second semiconducting oxide transistor.

21. The display gate driver circuit of claim 20, further comprising:
a discharge circuit configured to discharge at least one of the gate terminal of the first semiconducting oxide transistor and the gate terminal of the second semiconducting oxide transistor.

* * * * *